US009034681B2

(12) United States Patent
Cheng

(10) Patent No.: US 9,034,681 B2
(45) Date of Patent: May 19, 2015

(54) CHIP PACKAGE AND METHOD FOR FORMING THE SAME

(71) Applicant: XINTEC INC., Jhongli, Taoyuan County (TW)

(72) Inventor: Chia-Ming Cheng, New Taipei (TW)

(73) Assignee: Xintec Inc., Taoyuan (TW)

( * ) Notice: Subject to any disclaimer, the term of this patent is extended or adjusted under 35 U.S.C. 154(b) by 119 days.

(21) Appl. No.: 13/956,487

(22) Filed: Aug. 1, 2013

(65) Prior Publication Data

US 2013/0316494 A1 Nov. 28, 2013

Related U.S. Application Data

(62) Division of application No. 13/049,528, filed on Mar. 16, 2011, now Pat. No. 8,530,985.

(60) Provisional application No. 61/315,220, filed on Mar. 18, 2010.

(51) Int. Cl.
*H01L 21/00* (2006.01)
*H01L 23/00* (2006.01)
*B81B 7/00* (2006.01)

(52) U.S. Cl.
CPC ................ *H01L 24/85* (2013.01); *B81B 7/007* (2013.01); *B81C 2203/0118* (2013.01); *H01L 2924/00014* (2013.01); *H01L 2224/85* (2013.01); *H01L 2924/12041* (2013.01); *H01L 2924/1461* (2013.01)

(58) Field of Classification Search
USPC ................................................ 438/52, 51, 50
See application file for complete search history.

(56) References Cited

U.S. PATENT DOCUMENTS 5,770,883 A 6/1998 Mizuno et al.
6,104,073 A 8/2000 Ferrari et al.
6,417,560 B1 * 7/2002 Okawa et al. ................ 257/659
6,595,054 B2 7/2003 Paros et al.
6,768,207 B2 7/2004 Tao et al.
6,798,315 B2 9/2004 Schaefer
7,360,422 B2 4/2008 Madni et al.
7,414,500 B2 8/2008 De Los Santos
7,540,199 B2 6/2009 Fujii et al.
8,222,067 B2 * 7/2012 Yun et al. ........................ 438/52
2006/0225506 A1 10/2006 Madni et al.
2006/0226553 A1 10/2006 Campbell et al.
2007/0004096 A1 * 1/2007 Heuvelman ................... 438/127
2007/0044556 A1 3/2007 Tasaki
2007/0193355 A1 8/2007 Axelrod et al.
2008/0194053 A1 * 8/2008 Huang ........................... 438/53
2008/0290756 A1 * 11/2008 Huang .......................... 310/300
2009/0014819 A1 * 1/2009 Loeffler et al. ............... 257/415
2009/0229370 A1 9/2009 Fujii et al.

(Continued)

*Primary Examiner* — Nitin Parekh

(74) *Attorney, Agent, or Firm* — Birch, Stewart, Kolasch & Birch, LLP

(57) ABSTRACT

An embodiment of the invention provides a chip package, which includes: a substrate having an upper surface and a lower surface; a passivation layer located overlying the upper surface of the substrate; a plurality of conducting pad structures disposed overlying the upper surface of the substrate, wherein at least portions of upper surfaces of the conducting pad structures are exposed; a plurality of openings extending from the upper surface towards the lower surface of the substrate; and a plurality of movable bulks located between the openings and connected with the substrate, respectively, wherein each of the movable bulks is electrically connected to one of the conducting pad structures.

17 Claims, 7 Drawing Sheets

112 114
120 110 116
124
100a
104
102
100
100b 122

(56) References Cited

U.S. PATENT DOCUMENTS

| | | | | |
|---|---|---|---|---|
| 2010/0140776 | A1 | 6/2010 | Trezza | |
| 2010/0213603 | A1* | 8/2010 | Smeys et al. | 257/698 |
| 2010/0230767 | A1* | 9/2010 | Takagi et al. | 257/417 |
| 2010/0258951 | A1 | 10/2010 | Gabara | |

* cited by examiner

CHIP PACKAGE AND METHOD FOR FORMING THE SAME

CROSS-REFERENCES TO RELATED APPLICATIONS

This application is a Divisional of co-pending application Ser. No. 13/049,528, filed on Mar. 16, 2011, the entire contents of which are hereby incorporated by reference and for which priority is claimed under 35 U.S.C. §120. This application also claims priority under 35 U.S.C. §119(a) on U.S. Provisional Application No. 61/315,220 filed in Taiwan on Mar. 18, 2010, the entire contents of which are hereby incorporated by reference.

BACKGROUND OF THE INVENTION

1. Field of the Invention

The present invention relates to a chip package, and in particular relates to a MEMS chip package.

2. Description of the Related Art

With the advancements in technology, the packaging process of chips has become more complex and now require heavy and complicated patterning processes, including an etching process. In addition, formed chip packages often need to be integrated with another electronic device for different applications.

Thus, it is desired to have a more simple chip packaging process, wherein not only are devices (such as conducting pads) protected from damage, but also the integration between the chip package and other electronic devices are simplified.

BRIEF SUMMARY OF THE INVENTION

An embodiment of the invention provides a chip package, which includes: a substrate having an upper surface and a lower surface; a passivation layer located overlying the upper surface of the substrate; a plurality of conducting pad structures disposed overlying the upper surface of the substrate, wherein at least portions of upper surfaces of the conducting pad structures are exposed; a plurality of openings extending from the upper surface towards the lower surface of the substrate; and a plurality of movable bulks located between the openings and connected with the substrate, respectively, wherein each of the movable bulks is electrically connected to one of the conducting pad structures.

An embodiment of the invention provides a method for forming a chip package, which includes: providing a substrate having at least a device region and a pad region, wherein a plurality of conducting pad structures are disposed overlying the pad region of the substrate, a passivation layer and an etch stop layer are sequentially disposed overlying an upper surface of the substrate, and the passivation layer and the etch stop layer have a plurality of openings on the device region, wherein the openings expose the upper surface of the substrate; using the etch stop layer as a mask to remove a portion of the substrate to form a plurality of openings and a plurality of movable bulks between the openings, wherein the openings extend from the upper surface towards a lower surface of the substrate, the movable bulks connect with the substrate, and each of the movable bulks is electrically connected to one of the conducting pad structures; and removing the etch stop layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
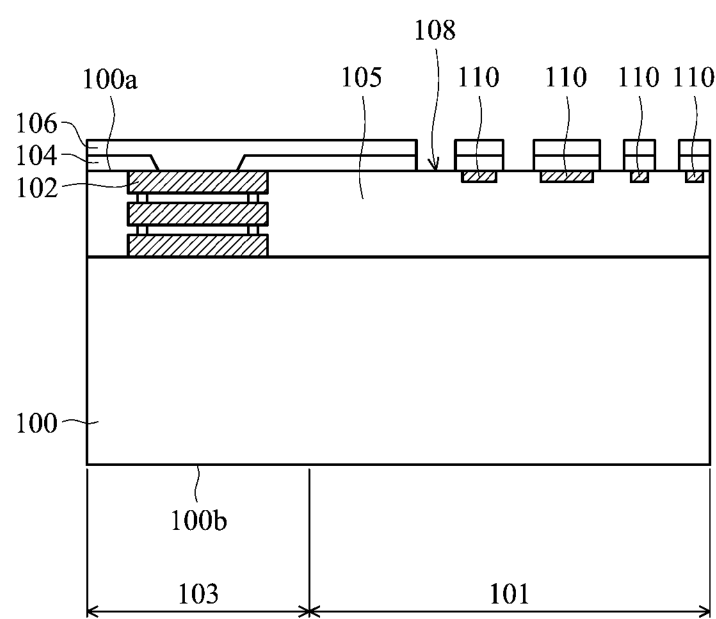
FIGS. 1A-1F are cross-sectional views showing the steps of forming a chip package according to an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer include embodiments where the first and second layers are in direct contact and those where one or more layers are interposing the first and second layers.

A chip package according to an embodiment of the present invention may be used to package a micro electro mechanical system chip. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

In the following description, a MEMS chip package is taken as an example with references made to the accompanying drawings to illustrate a chip package according to an embodiment of the invention. For example, in one embodiment, the packaged MEMS chip may include an accelerator.

FIGS. 1A-1F are cross-sectional views showing the steps of forming a chip package according to an embodiment of the present invention. As shown in FIG. 1 A, a substrate 100 is provided, which has at least a device region 101 and at least a pad region 103. The substrate 100 includes, for example, a semiconductor material or a ceramic material. In one embodiment, the substrate 100 is a semiconductor wafer such as a silicon wafer, and thus a wafer-level package process may be performed. Fabrication cost and fabrication time may be reduced if a chip package is formed by a wafer-level package process.

As shown in FIG. 1A, in one embodiment, the pad region 103 of the substrate 100 has a plurality of conducting pad structures 102 which are disposed overlying the upper surface 100*a* of the substrate 100. Although only a conducting pad is shown in FIG. 1A, one skilled in the art should understand that a plurality of pads may be stacked and/or arranged on the substrate 100. For example, in one embodiment, the pad region 103 surrounds the device region 101. The pad region 103 has a plurality of conducting pad structures 102 which also surround the device region 101. In addition, in one embodiment, the conducting pad structure 102 is a plurality of conducting pads which are stacked with each other, at least a conducting pad, or a conducting pad structure constructed of at least a conducting pad and at least an interconnection structure. The conducting pads may be formed in, for example, a dielectric layer 105 in the substrate 100 and electrically connected to each other through interconnections formed in the dielectric layer 105.

As shown in FIG. 1A, in one embodiment, a passivation layer 104 and an etch stop layer 106 are subsequently disposed overlying the upper surface 100*a* of the substrate 100. Typically, a semiconductor wafer fabricated by a wafer fabrication facility is covered by a chip passivation layer such as the passivation layer 104. Meanwhile, in order to form electrical connections between the devices inside the chip and the external circuits, the passivation layer is typically defined to form a plurality of openings exposing the conducting pad structure 102.

As shown in FIG. 1A, the passivation layer 104 and the etch stop layer 106 are patterned to have a plurality of openings 108 exposing the substrate 100 thereunder. In addition, in one embodiment, a plurality of conducting wires 110 may be on the substrate 100 between the openings 108. These conducting wires 110 are electrically connected to the corresponding conducting pad structures 102, respectively. The conducting wire 110 may be formed overlying, for example, the upper surface 100*a* of the substrate 100 and be covered by the passivation layer 104. Alternatively, the conducting wire 110 may also be formed in the dielectric layer 105 of the substrate 100. In this case, the dielectric layer 105 is regarded as a portion of the substrate 100, and the upper surface of the dielectric layer 105 is regarded as the upper surface 100*a* of the substrate 100. The conducting wire 110 may be, for example, a conducting wire formed of a metal material. Alternatively, in one embodiment, the conducting wire 110 includes an elastic conducting structure formed of a semiconductor material. For example, a portion of the semiconductor substrate may be patterned to be a structure similar to a spring by a patterning process. In one embodiment, the conducting wire 110 is electrically connected to the substrate 100.

Figure 1B:
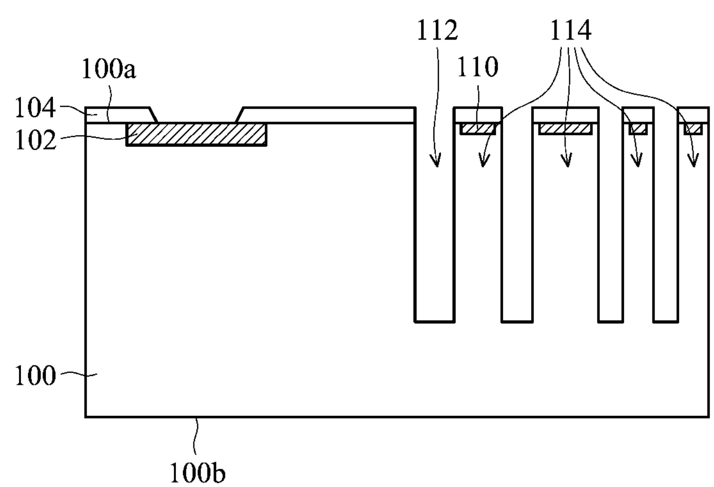

Then, referring to FIG. 1B, note that the dielectric layer 105 and the plurality of conducting pad are not shown in the drawing for the purpose of convenience, and a single-layer conducting pad structure 102 is shown in the drawing for simplicity. As shown in FIG. 1B, the etch stop layer 106 is used as a mask and a portion of the substrate 100 is removed from the upper surface 100*a* of the substrate 100 exposed by the openings 108 to form a plurality of openings 112 by, for example, an etching process, and a plurality of movable bulks 114 are formed between the openings 112. That is, the remaining substrate between the openings 112 has reduced constraint and thus become the movable bulks 114 which can move, bend, or vibrate if an external force is applied.

As shown in FIG. 1B, in one embodiment, the etch stop layer 106 may be removed after the openings 112 are formed. In another embodiment, when the substrate 100 is partially removed to form the openings 112, simultaneously, the etch stop layer 106 is etched. That is, in the etching process, the etchant which is used has a higher etchant rate for the substrate 100 than that for the etch stop layer 106. In one embodiment, a material of the etch stop layer 106 may be, for example, an oxide. In one embodiment, by tuning the material, thickness, and/or etching conditions of the etching stop layer 106, the etch stop layer 106 may be substantially and completely removed from the substrate 100 after the openings 112 have been formed. In this case, the upper surfaces of the conducting pad structures 102 are at least partially exposed.

As shown in FIG. 1B, in one embodiment, the opening 112 extends from the upper surface 100*a* towards the lower surface 100*b* of the substrate 100. In addition, each of the movable bulks 114 is electrically connected to one of the conducting pad structures 102 correspondingly. For example, the movable bulk 114 may be electrically connected to the conducting pad structure 102 through the conducting wire 110 thereon. In one embodiment, the movable bulk 114 connects with the substrate 100, and the materials of the movable bulk 114 and the substrate 100 are the same, as shown in FIG. 1B. For example, both the materials of the substrate 100 and the movable bulk 114 may include a semiconductor material.

Figure 2:
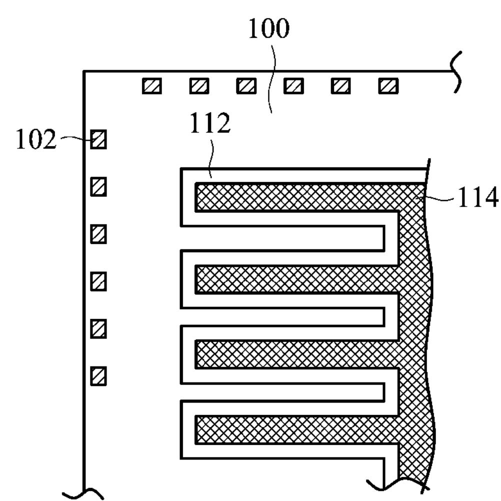
FIG. 2 is a top view partially showing a chip package according to an embodiment of the present invention.

FIG. 2 is a top view partially showing a chip package according to an embodiment of the present invention. When the chip package is applied by an external force and moves acceleratedly, the movable bulks 114 will bend due to the external force such that relative distances between the movable bulks 114 are changed. The changes of the relative distances cause changes in capacitance values. Thus, signals of the changes in capacitance values may be transmitted out through the conducting pad structures 102 electrically connected to the movable bulks 114.

In one embodiment, in order to increase the displacement of the movable bulks 114 to improve the sensitivity when an external force is applied thereto, an effort may be made to connect the openings 112. That is, percentage of the connection portions between the movable bulks 114 and the substrate 100 is reduced such that the freedom of vibration or movement of the movable bulks 114 is increased. For example, a trench may be formed from the lower surface 100*b* of the substrate 100 to expose the openings 112.

In one embodiment, before the trench connecting the openings 112 is formed, a package layer may be optionally disposed overlying the upper surface 100*a* of the substrate 100. For example, referring to FIG. 1C, a package layer 116 is provided and disposed overlying the upper surface 100*a* of the substrate 100. The package layer 116 may be, for example, a transparent substrate or a semiconductor substrate. In one embodiment, the package layer 116 may be a glass substrate or a silicon wafer. The package layer 116 may be used to protect the chip thereunder.

Figure 1C:
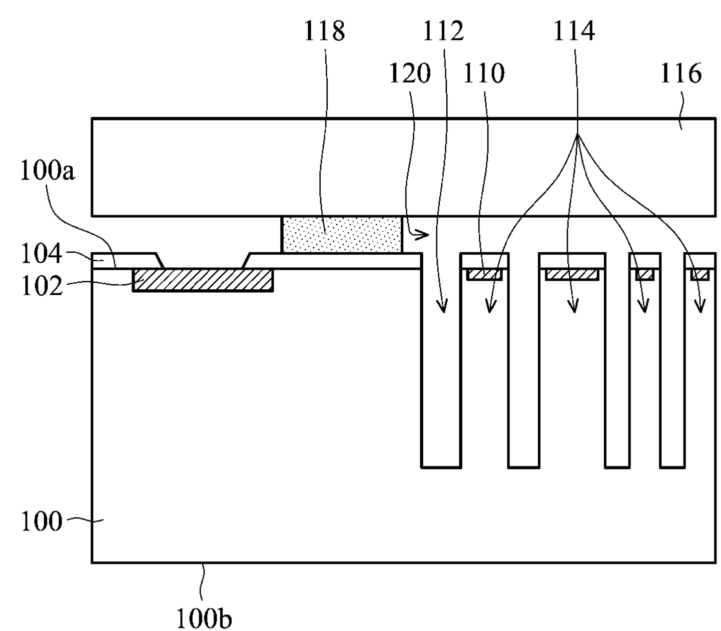

As shown in FIG. 1C, in one embodiment, a spacer layer 118 may be optionally disposed between the package layer 116 and the substrate 100. The spacer layer 118 may be an insulating material, for example. In one embodiment, the spacer layer 118, the substrate 100, and the package layer 116 together form a cavity 120. The opening 112 and the movable bulks 114 are located underlying the cavity 120. In one embodiment, the spacer layer 118 is disposed to surround the device region 101. Thus, the formed cavity is a substantially airtight cavity. Next, as shown in FIG. 1C, the substrate 100 may be optionally thinned from the lower surface 100*b* of the substrate 100 by, for example, mechanical grinding or chemical mechanical polishing.

Figure 1D:
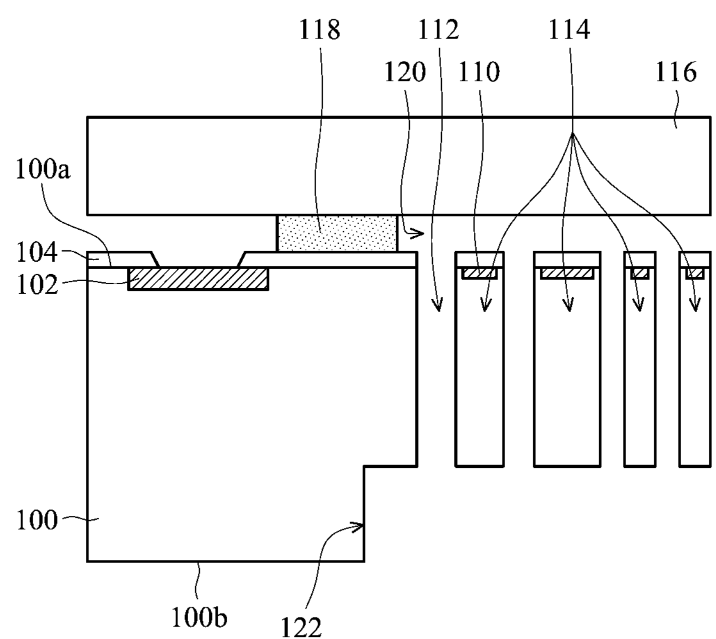

Next, as shown in FIG. 1D, a trench 122 is formed from the lower surface 100*b* of the substrate 100. The bottom portion of the trench 122 exposes the openings 112 such that the openings 112 connect with each other. After the trench 122 is formed, the movable bulks 114 connect with the substrate 100 only through the periphery portions (not shown). Thus, when the chip package is applied by an external force and moves acceleratedly, the movable bulks 114 will bend or move in response to the external force more easily such that the sensing sensitivity is increased.

Figure 1E:
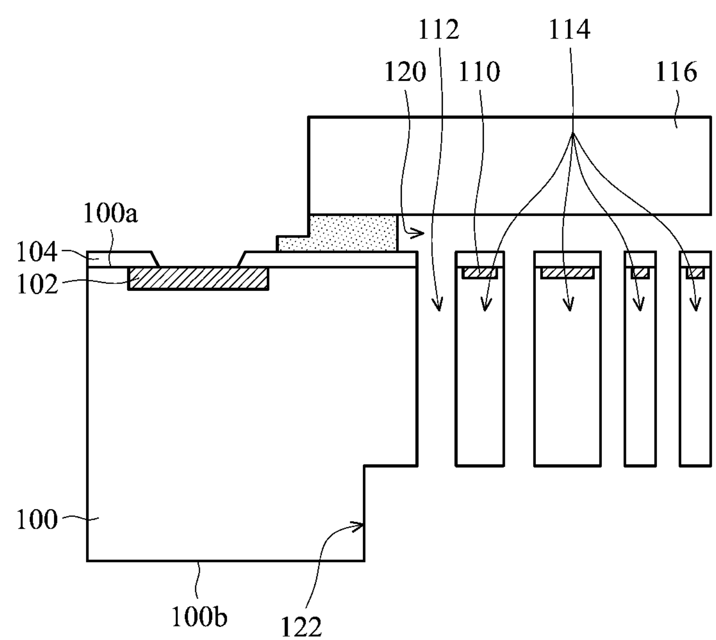

Next, as shown in FIG. 1E, a portion of the package layer 116 may be optionally removed such that the conducting pad structure 102 is not completely covered by the package layer 116. After the conducting pad structure 102 is at least partially exposed, it is easier for the conducting pad structure 102 to connect with another conducting structure.

Figure 1F:
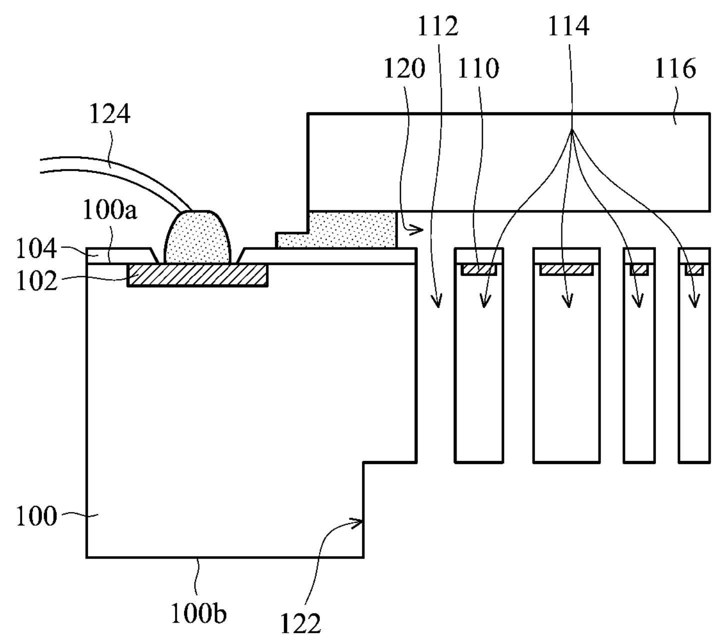

For example, as shown in FIG. 1F, in one embodiment, a conducting structure 124 may be formed overlying the conducting pad structure 102. The conducting structure 124 may be used to provide electrical connections between the chip package and another electronic device. The conducting structure 124 may be, for example, a bonding wire. Alternatively, in another embodiment, a through-substrate via may be formed under the bottom portion of the conducting pad structure 102 to serve as the conducting structure 124.

In one embodiment, the substrate 100 is a semiconductor wafer such as a silicon wafer. A plurality of structures similar to the structure shown in FIG. 1F are formed on the semiconductor wafer. In this case, the substrate 100 may be diced along predetermined scribe lines (not shown) on the substrate 100 to form a plurality of separate chip packages.

Embodiments of the invention have many variations. For example, in one embodiment, the passivation layer is not like the structure shown in FIG. 1A to cover a portion of the conducting pad structure 102. In this case, the upper surface of the conducting pad of the formed chip package substantially does not directly contact with any insulating material.

In embodiments of the invention, the etch stop layer is formed overlying the substrate such that the conducting pad structure is protected during the forming of the movable bulks, which prevents the conducting pad from being damaged due to the etching process. In addition, the etch stop layer may also be used as an etch mask for defining the openings surrounding the movable bulks. Further, the conducting pad structure of the chip package according to an embodiment of the invention is at least partially exposed such that the chip package may be connected with another conducting wire which facilitates integration with other electronic devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
- providing a substrate having an upper surface and a lower surface;
- disposing a passivation layer and a package layer overlying the upper surface of the substrate;
- disposing a spacer layer between the upper surface of the substrate and the package layer;
- disposing a plurality of conducting pad structures overlying the upper surface of the substrate, wherein at least portions of upper surfaces of the conducting pad structures are exposed;
- forming a plurality of openings through the passivation layer and extending from the upper surface towards the lower surface of the substrate; and
- disposing a plurality of movable bulks between the openings and connected with the substrate, respectively, wherein each of the movable bulks is electrically connected to one of the conducting pad structures respectively, and wherein the substrate, the spacer layer, and the package layer together form a cavity, and the openings and the movable bulks are located underlying the cavity.

2. The method for forming a chip package as claimed in claim 1, wherein the openings connect with each other.

3. The method for forming a chip package as claimed in claim 1, further comprising forming a trench extending from the lower surface towards the upper surface of the substrate, wherein a bottom portion of the trench exposes the openings.

4. The method for forming a chip package as claimed in claim 1, wherein the package layer does not completely cover the conducting pad structures.

5. The method for forming a chip package as claimed in claim 1, wherein the package layer does not cover the conducting pad structures.

6. The method for forming a chip package as claimed in claim 1, further comprising disposing a conducting structure electrically connected to the conducting pad structures.

7. The method for forming a chip package as claimed in claim 6, wherein the conducting structure comprises a bonding wire.

8. The method for forming a chip package as claimed in claim 1, further comprising disposing a plurality of conducting wires respectively and correspondingly on the movable bulks, wherein the conducting wires electrically connect the movable bulks and the conducting pad structures, respectively and correspondingly.

9. A method for forming a chip package, comprising:
- providing a substrate having an upper surface and a lower surface;
- disposing a passivation layer overlying the upper surface of the substrate;
- disposing a plurality of conducting pad structures overlying the upper surface of the substrate, wherein at least portions of upper surfaces of the conducting pad structures are exposed;
- forming a plurality of openings through the passivation layer and extending from the upper surface towards the lower surface of the substrate;
- disposing a plurality of movable bulks between the openings and connected with the substrate, respectively, wherein each of the movable bulks is electrically connected to one of the conducting pad structures respectively; and
- disposing a plurality of conducting wires respectively and correspondingly located on the movable bulks, wherein the conducting wires electrically connect the movable bulks and the conducting pad structures, respectively and correspondingly.

10. The method for forming a chip package as claimed in claim 9, wherein the openings connect with each other.

11. The method for forming a chip package as claimed in claim 9, further comprising forming a trench extending from the lower surface towards the upper surface of the substrate, wherein a bottom portion of the trench exposes the openings.

12. The method for forming a chip package as claimed in claim 9, further comprising disposing a package layer overlying the upper surface of the substrate.

13. The method for forming a chip package as claimed in claim 12, wherein the package layer does not completely cover the conducting pad structures.

14. The method for forming a chip package as claimed in claim 12, wherein the package layer does not cover the conducting pad structures.

15. The method for forming a chip package as claimed in claim 12, further comprising disposing a spacer layer between the upper surface of the substrate and the package layer.

16. The method for forming a chip package as claimed in claim 9, further comprising disposing a conducting structure electrically connected to the conducting pad structures.

17. The method for forming a chip package as claimed in claim 16, wherein the conducting structure comprises a bonding wire.

* * * * *